(12) United States Patent
Ide et al.

(10) Patent No.: US 10,338,152 B2
(45) Date of Patent: Jul. 2, 2019

(54) INTERNAL CONDITION ESTIMATING SYSTEM AND ESTIMATING METHOD

(71) Applicant: Kabushiki Kaisha Toshiba, Tokyo (JP)

(72) Inventors: Makoto Ide, Tokyo (JP); Masahiro Tohara, Tokyo (JP); Mami Mizutani, Tokyo (JP); Takenori Kobayashi, Tokyo (JP); Tsutomu Tanno, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 846 days.

(21) Appl. No.: 14/842,477

(22) Filed: Sep. 1, 2015

(65) Prior Publication Data
US 2016/0025814 A1 Jan. 28, 2016

Related U.S. Application Data

(63) Continuation of application No. PCT/JP2015/055164, filed on Feb. 24, 2015.

(30) Foreign Application Priority Data

Jul. 25, 2014 (JP) .................................. 2014-151904

(51) Int. Cl.
*G01R 31/36* (2019.01)
*G01R 31/388* (2019.01)
(Continued)

(52) U.S. Cl.
CPC ......... *G01R 31/388* (2019.01); *G01R 31/396* (2019.01); *G01R 31/367* (2019.01); *G01R 31/3842* (2019.01)

(58) Field of Classification Search
CPC ............ G01R 31/3637; G01R 31/3651; G01R 31/3624; G01R 31/3658
See application file for complete search history.

(56) References Cited

U.S. PATENT DOCUMENTS 6,020,718 A 2/2000 Ozawa et al.
8,930,070 B2 1/2015 Boehm et al.
(Continued)

FOREIGN PATENT DOCUMENTS

JP H11-55865 A 2/1999
JP 2001-153935 A 6/2001
(Continued)

OTHER PUBLICATIONS

International Search Report and Written Opinion issued in related PCT Application No. PCT/JP2015/055164, 8 pages. (Translation not yet available.).
(Continued)

*Primary Examiner* — Vinh P Nguyen
*Assistant Examiner* — Zannatul Ferdous
(74) *Attorney, Agent, or Firm* — Baker Botts L.L.P.

(57) ABSTRACT

A method of estimating, as the charging rate of an electricity storage system, the internal condition of the electricity storage system including plural batteries, and an internal condition estimating system utilizing that method are provided. A voltage measuring unit 3 measures voltages of all batteries 1 configuring an electricity storage system block 2. A system cell voltage determining unit 5 determines a system cell voltage that will be a reference for an estimation of the SOC value of the electricity storage system block 2 based on the voltage value of the plural batteries 1 measured by the voltage measuring unit 3. The system cell voltage determining unit 5 obtains the system cell voltage by giving a weighting to the voltage value in accordance with the pre-calculated SOC value of the electricity storage system block 2. The system SOC estimating unit 6 estimates the SOC value of the electricity storage system block 2 based on the current flowing through the battery 1 and the system cell voltage.

13 Claims, 9 Drawing Sheets

(51) Int. Cl.
*G01R 31/396* (2019.01)
*G01R 31/3842* (2019.01)
*G01R 31/367* (2019.01)

(56) References Cited

U.S. PATENT DOCUMENTS

| | | |
|---|---|---|
| 2007/0145954 A1 | 6/2007 | Kawahara et al. |
| 2008/0203975 A1* | 8/2008 | Burlak ............... H02H 3/12 320/161 |
| 2009/0096423 A1* | 4/2009 | Aswani ............... H02J 7/0093 320/139 |
| 2009/0102672 A1* | 4/2009 | Petek ............... G08B 29/181 340/636.15 |
| 2009/0174369 A1 | 7/2009 | Kawahara et al. |
| 2011/0080139 A1* | 4/2011 | Troxel ............... H02J 7/007 320/134 |
| 2014/0055100 A1* | 2/2014 | Igarashi ............... H02J 7/00 320/152 |
| 2014/0117939 A1 | 5/2014 | Lim |
| 2014/0156209 A1* | 6/2014 | Yuan ............... G01R 31/3606 702/63 |
| 2015/0106044 A1 | 4/2015 | Driemeyer-Franco et al. |
| 2015/0369873 A1* | 12/2015 | Nakao ............... G01R 31/3606 702/63 |

FOREIGN PATENT DOCUMENTS

| | | |
|---|---|---|
| JP | 2012-063244 A | 3/2012 |
| JP | 2012-177588 A | 9/2012 |
| JP | 2013-513809 A | 4/2013 |
| JP | 2013-178202 A | 9/2013 |
| JP | 2014025739 A | 2/2014 |
| WO | 2013167833 A1 | 11/2013 |

OTHER PUBLICATIONS

Office Action issued in related Korean Application No. 10-2015-7024152, dated Aug. 19, 2016 (11 pages).

* cited by examiner

INTERNAL CONDITION ESTIMATING SYSTEM AND ESTIMATING METHOD

CROSS-REFERENCE TO RELATED APPLICATION

This application is a Continuation of PCT Application No. PCT/JP2015/055164, filed on Feb. 24, 2015, and claims priority to Japanese Patent Application No. 2014-151904, filed on Jul. 25, 2014, the entire contents of both of which are incorporated herein by reference.

FIELD

Embodiments of the present disclosure relate to a method of estimating, as a charging rate of an electricity storage system, an internal condition of the electricity storage system that includes plural batteries, and, an internal condition estimating system that utilizes this method.

BACKGROUND

In general, a purpose of battery internal condition estimating methods is to estimate a charging rate (SOC: State Of Charge) of a battery. An example method of estimating an SOC value is to total integrated values of charge/discharge currents with reference to a relationship between an open circuit voltage (OCV: Open Circuit Voltage) that is a voltage when no current is flowing and the SOC, thereby estimating the SOC.

When, however, charging/discharging is always performed like an application of an output fluctuation suppression for wind power generation, it is difficult to obtain the OCV, and when the charging/discharging continues for a long time, minute current integration errors are accumulated. Hence, eventually, the charging/discharging should be purposefully stopped to reset such errors and to obtain the OCV. A method that can cope with this problem is an SOC estimating method that utilizes a Karman filter.

According to the SOC estimating method that utilizes a Karman filter, a current actual measurement value and a voltage actual measurement value detected by respective detectors connected with a battery are obtained, and based on those measurement values, a battery equivalent circuit model that includes resistances and capacitors is created using the Karman filter. Next, the OCV is estimated based on this battery equivalent circuit model, and the SOC is calculated based on relationship data between the OCV estimated value and the SOC of the batteries. By sequentially applying a capacitor capacitance obtained from the OCV estimated value obtained at the last sampling time, a highly precise SOC is obtainable.

According to the above battery internal condition estimating method, however, the SOC can be estimated when the battery is a single unit, but when this method is applied to estimate the SOC (hereinafter, referred to as a system SOC) of an electricity storage system that has plural batteries connected by multiple parallel-series connection scheme, it is unclear which voltage of the battery should be applied for the estimation.

In addition, a method of estimating respective SOCs of all batteries and adopting the average value thereof as a system SOC is possible, but in the case of a large-scale electricity storage system, it is necessary to perform calculation battery by battery although the number of batteries is quite large, and thus the amount of calculation may increase.

SUMMARY

Embodiments of the present disclosure have been made to address the above technical problems, and are to efficiently estimate an internal SOC of an electricity storage system that includes plural batteries. A system cell voltage is obtained by weighting the voltage value of the battery that configures the electricity storage system, and a system SOC of the electricity storage system is estimated based on the system cell voltage. Hence, an internal condition estimating system and an estimating method by this system are provided which can reduce an amount of calculation.

An internal condition estimating system of the embodiments of the present disclosure employs the following structure to accomplish the above objective.

(1) A voltage measuring unit that measures a voltage of a plurality of batteries.

(2) A current measuring unit that measures a current flowing through the plurality of batteries.

(3) A system cell voltage determining unit that determines, based on a voltage value of the plurality of batteries measured by the voltage measuring unit, a system cell voltage that is a reference for an estimation of the SOC of the electricity storage system block.

(4) A system SOC estimating unit that estimates, based on the current flowing through the battery and the system cell voltage, the SOC of the electricity storage system block.

(5) The system cell voltage determining unit determines the system cell voltage by giving a weighting to the voltage value in accordance with a pre-calculated SOC of the electricity storage system block.

In addition, an internal condition estimating method of estimating the SOC of the electricity storage system block that includes plural batteries is also an aspect of the embodiments of the present disclosure.

DETAILED DESCRIPTION

1. First Embodiment

An internal condition estimating system according to a first embodiment of the present disclosure will be explained below with reference to FIGS. 1 to 4. The internal condition estimating system of this embodiment estimates a system SOC of an electricity storage system block that includes plural batteries. The internal condition estimating system estimates the system. SOC of the electricity storage system block, thereby estimating the internal condition of the electricity storage system block. As for the estimation of the system SOC, voltage values of all batteries that configure the electricity storage system block are measured, any voltage value of those measured voltage values is selected, and a weighting is given to the selected voltage value to obtain a system cell voltage. When the system SOC is estimated, the estimation is performed based on this system cell voltage.

(1. Structure)

Figure 1:
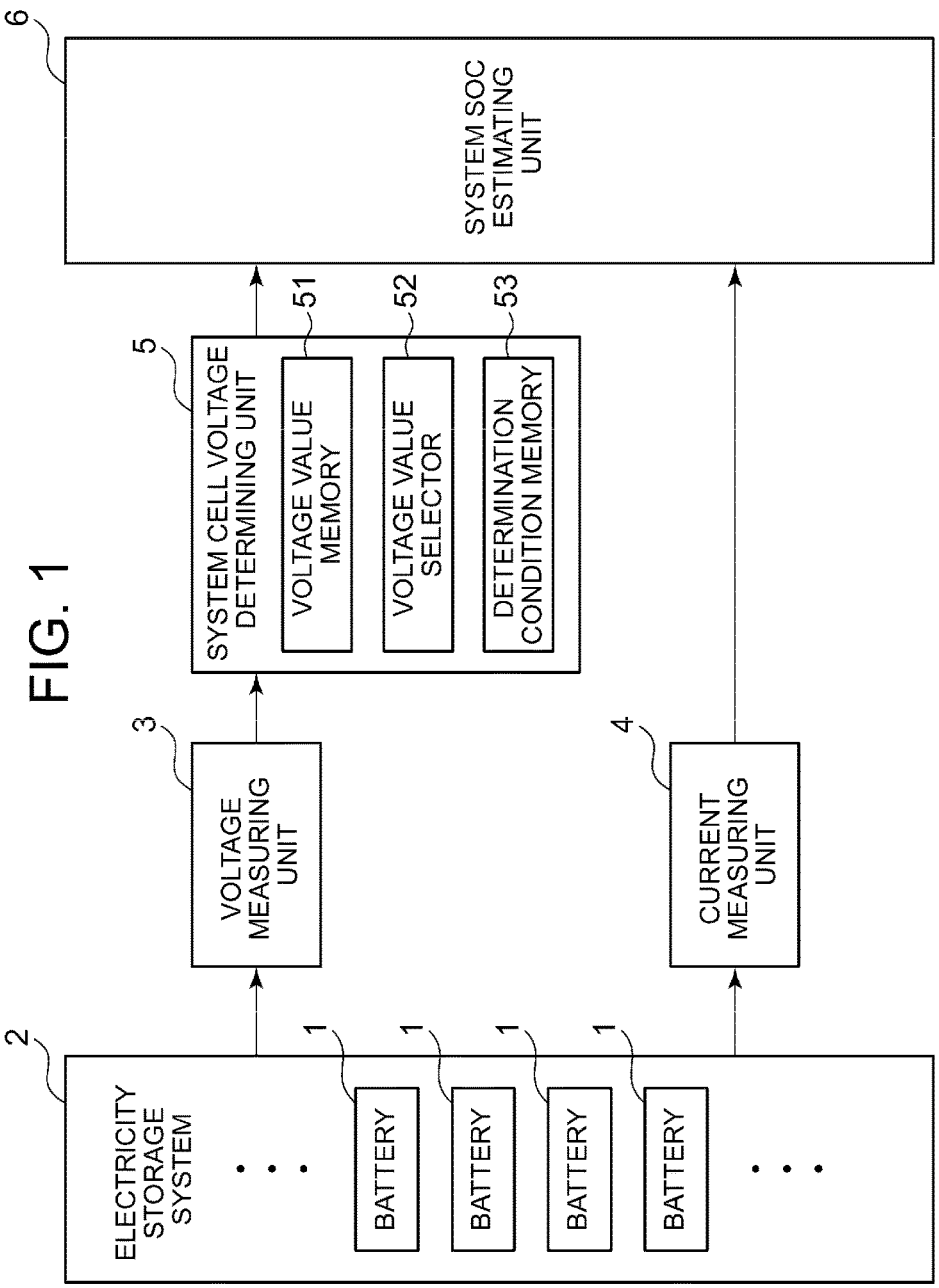
FIG. 1 is a block diagram illustrating a structure of an internal condition estimating system according to a first embodiment of the present disclosure.

FIG. 1 is a structural diagram illustrating an outline of the internal condition estimating system of this embodiment. The internal condition estimating system of this embodiment is connected with an electricity storage system block 2 that includes plural batteries 1. The internal condition estimating system measures the voltage of each battery that constructs the electricity storage system block 2, gives a weighting to this voltage, and determines a system cell voltage. A system SOC of the electricity storage system is estimated based on this determined system cell voltage and a current flowing through each battery. The internal condition estimating system includes, to estimate the system SOC, a voltage measuring unit 3, a current measuring unit 4, a system cell voltage determining unit 5, and a system SOC estimating unit 6.

The electricity storage system block 2 subjected to the estimation has the plural batteries 1 electrically connected one another, and has larger rated capacity and rated output than those of a single battery 1. The battery 1 is a so-called secondary battery that can repeat charging/discharging. As for the connection of the batteries 1 in the electricity storage system block 2, a multiple series connection of the plural batteries 1 in series, a multiple parallel connection of the plural batteries 1 in parallel, or, a multiple parallel-series connection of plural parallel-connection groups each including plural batteries 1 connected in series.

The voltage measuring unit 3 measures the voltages of all batteries 1 that configure the electricity storage system block 2. The voltage measuring unit 3 measures a voltage V by an arbitrary method. When, for example, the electricity storage system block 2 includes m number of batteries 1, as for the measurement-target batteries 1, voltage values V1 to Vm are measured, and the measured voltage values V1 to Vm of the respective batteries 1 are output to the system cell voltage determining unit 5.

The current measuring unit 4 measures each current flowing through each battery 1 in the electricity storage system block 2. An arbitrary method is applicable as the method of measuring a current flowing through each battery 1. Current information of each battery 1 measured by the current measuring unit 4 is output to the system SOC estimating unit 6.

The system cell voltage determining unit 5 determines a system cell voltage Vsys of the electricity storage system block 2 based on the voltage values V1 to Vm of the batteries 1 transmitted from the voltage measuring unit 3. The system cell voltage Vsys is a voltage applied to estimate the SOC of the electricity storage system block 2.

The system cell voltage determining unit 5 selects any of the voltage values V1 to Vm of the batteries 1, gives a weighting in accordance with the pre-calculated system SOC of the electricity storage system block 2, thereby obtaining the system cell voltage Vsys. Any value selected among the voltage values V1 to m of the batteries 1 is the maximum voltage value (hereinafter, referred to as a maximum voltage Vmax) among the voltage values V1 to Vm, and the minimum voltage value (hereinafter, referred to as a minimum voltage Vmin).

The system cell voltage determining unit 5 includes, in order to determine the system cell voltage Vsys, a voltage value memory 51, a voltage value selector 52, and determination condition memory 53.

The voltage value memory 51 stores the voltage values V1 to Vm of the batteries 1 transmitted from the voltage measuring unit 3. The stored voltage values V1 to Vm are for all batteries 1 in the electricity storage system block 2 per a time, and for example at a time t1, voltage values Vt1 to Vtm are stored.

The voltage value selector 52 selects the voltage value applied when the system cell voltage Vsys is determined. As for the determination of the system cell voltage Vsys, when the maximum voltage Vmax and the minimum voltage Vmin are applied, the voltage value selector 52 selects, among the voltage values stored in the voltage value memory 51 and at a given time, the maximum voltage Vmax and the minimum voltage vmin. When, for example, the voltage value memory 51 stores the voltage values Vt1 to Vtm at the time t1, the maximum value among the voltage values Vt1 to Vtm is taken as the maximum voltage Vmax, and the minimum voltage is taken as the minimum voltage Vmin.

The determination condition memory 53 stores a condition for giving a weighting to the selected voltage value. As for weighting, a preferable condition is that the maximum voltage Vmax is dominant within a region where the system SOC of the electricity storage system block 2 is high, and the minimum voltage Vmin is dominant within a region where the system SOC is low. When, for example, the system cell voltage Vsys is determined from the following formula (1) where Vmax is the maximum voltage and Vmin is the minimum voltage, the determination condition memory 53 stores this formula (1).

[Formula 1]

$$V\text{sys} = f(\text{SOC}) \times V\text{max} + \{1 - f(\text{SOC})\} \times V\text{min} \quad \text{Formula (1)}$$

where f(SOC) is a function depending on SOC.

The condition for weighting stored in the determination condition memory 53 may be changed in accordance with the structure of the installed electricity storage system block 2 and the installation location, etc. Hence, the determination condition memory 53 may store plural conditions to determine the system cell voltage Vsys, and for example, the following conditions may be stored. The example patterns of weighting stored in the determination condition memory 53 are as follows.

(1) First Pattern: When the SOC region for charging/discharging is the low SOC region, the minimum voltage is adopted dominantly, and in the case of the high SOC region, the maximum voltage is adopted dominantly.

According to this pattern, weighting is performed on the minimum voltage value and the maximum voltage value in accordance with the pre-calculated system SOC. In this case, Vsys can be expressed by the following formula.

[Formula 2]

$$V\text{sys}=\text{SOC}[\%]/100 \times V\text{max}+(100-\text{SOC}[\%])/100 \times V\text{min} \quad (2)$$

(2) Second Pattern: When the SOC region for charging/discharging is less than a threshold A, the minimum voltage is adopted, and in the case of equal to or greater than the threshold A, the maximum voltage is adopted.

According to this pattern, the voltage value to be adopted as the system cell voltage Vsys is changed from the minimum voltage value to the maximum voltage value or from the maximum voltage value to the minimum voltage value in accordance with the pre-calculated system SOC value of the electricity storage system block 2. That is, when the SOC value is less than the threshold A, the minimum voltage is adopted, and in the case of equal to or greater than the threshold A, the maximum voltage is adopted. In this case, Vsys can be expressed by the following formula.

[Formula 3]

$$V\text{sys}=V \quad (3)$$

where: (SOC<A %: V=Vmin, A %≤SOC: V=Vmax); and (0%≤A≤100%).

As is clear from the above formula 3, the threshold A can be set freely within a range between 0% and 100%. However, at the time of charging/discharging of the electricity storage system block 2, when the SOC is around zero or around 100 that shows the end of discharging of the electricity storage system block 2 or the end of charging thereof, an increase or decrease of the battery voltage becomes remarkably sharp. Conversely, in the regions other than the end of charging or discharging, the increase or decrease of the battery voltage becomes relatively gradual. When the increase or decrease of the battery voltage becomes remarkably sharp, the difference in voltage value among the batteries 1 in the electricity storage system block 2 becomes large. Hence, the value of the system cell voltage Vsys calculated based on such a value largely changes. Accordingly, it is preferable that the threshold A should be set within a range where the increase of decrease of the battery voltage is relatively gradual. For example, in the cases of FIGS. 3 to 6, the threshold is set within the range between 20% and 80%. This range is merely an example, and depending on the type of the battery 1, the range where the increase or decrease of the battery voltage becomes relatively gradual may be within a range between 30% and 60%, but in this case, it is desirable that the threshold A should be set in accordance with the type of the battery 1 applied to the electricity storage system block 2.

(3) Third Pattern: When the SOC region for charging/discharging is less than the threshold A, the minimum voltage is adopted, and in the case of equal to or greater than the threshold A, the maximum voltage is adopted, and, between those regions, an average voltage is adopted.

According to this pattern, voltage value information to be adopted is changed in accordance with the SOC of the electricity storage system block 2 among three battery voltages. That is, when the SOC of the electricity storage system block 2 is around the minimum value, the minimum voltage is adopted, when the SOC of the electricity storage system block 2 is around the center, an average voltage value is adopted, and when the SOC of the electricity storage system block 2 is around the maximum value, the maximum voltage value is adopted. In this case, Vsys can be expressed by the following formula.

[Formula 4]

$$V\text{sys}=V \quad (4)$$

where
(SOC<A %: V=Vmin
A %≤SOC<B %: V=Vave
A %≤SOC: V=Vmax)
(However, Vave=(Vmin+Vmax)/2, 0%≤A≤100%, and A<B)

As is clear from the above formula (4), the threshold A can be set freely within a range between 0% and 100% as long as the threshold A is smaller than the threshold B. In order to reduce a change in value of the calculated system cell voltage Vsys, like the first pattern, the threshold A and the threshold B are preferably set within a range where the increase or decrease of the battery voltage is relatively gradual. In addition, it is desirable that a predetermined margin should be set between the threshold A and the threshold B.

The system cell voltage Vsys determined through any one of the above first to third patterns is transmitted to the system SOC estimating unit 6 connected with the system cell voltage determining unit 5.

The system SOC estimating unit 6 estimates the SOC of the electricity storage system block 2 based on the input system cell voltage Vsys and the current value of each battery 1 measured by the current measuring unit 4. As for the estimation of the SOC of the electricity storage system block 2, when the batteries 1 are connected by multiple parallel-series connection scheme, the SOC by what corresponds to a series string is calculated from the value of current flowing through a series string, and the SOC average value of the respective series strings is taken as the SOC of the electricity storage system block 2. In addition, the SOC of the electricity storage system block 2 may be estimated based on the average value of current flowing through other parallel strings.

The system SOC estimated in this case is a value that indicates the internal condition of the electricity storage system block 2. The estimation method of the system SOC by the system SOC estimating unit 6 applicable is an arbitrary method. For example, as described in JP2003-70251 A, a battery equivalent circuit model including resistances and capacitors may be utilized, or using the characteristic data of the battery, the SOC may be calculated based on relationship data between the OCV and the SOC.

[1-2. Action]

Figure 2:
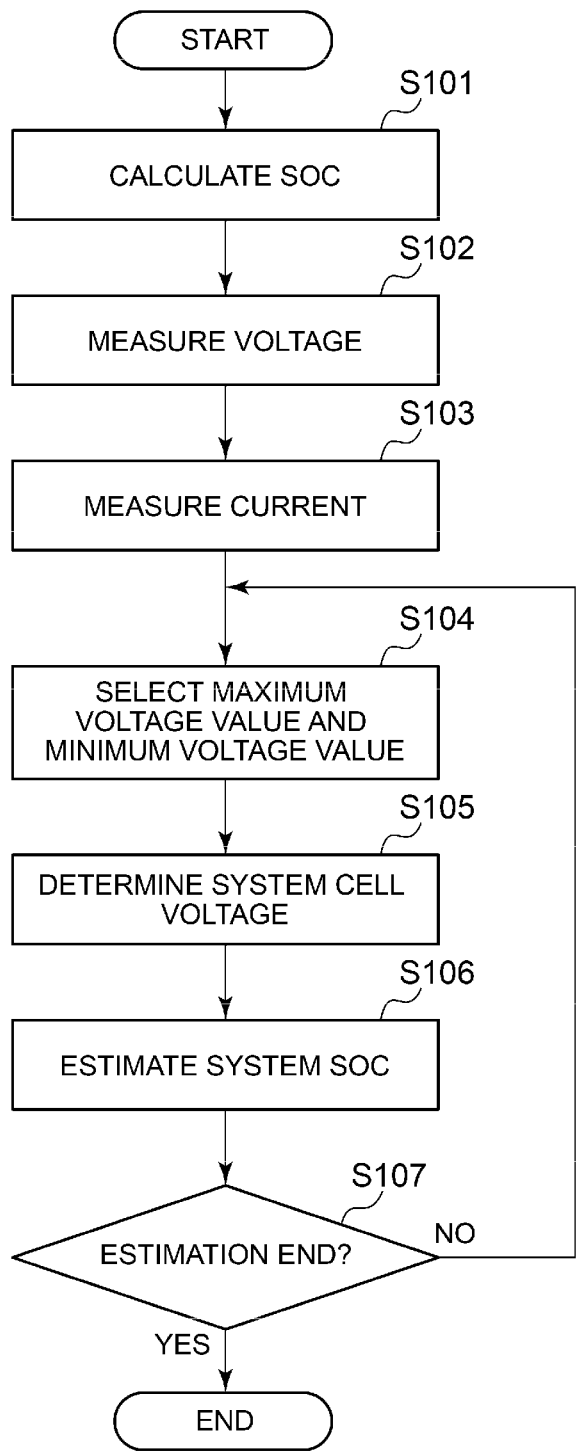
FIG. 2 is a flowchart illustrating an operation of the internal condition estimating system according to the first embodiment of the present disclosure.

The operation of the internal condition estimating system illustrated in FIG. 1 and employing the above structure is generally as follow. FIG. 2 is a flowchart illustrating processes of estimating the internal condition of the electricity storage system block 2 by the internal condition estimating system.

When the estimation of the internal condition starts, a provisional system SOC is calculated (S101). In this embodiment, the pre-calculated system SOC is necessary to estimate the system SOC. When the system SOC has been already estimated, this estimated system SOC is applicable, but at the time of the start of the system operation, no system SOC has been estimated. Hence, the system SOC at the time of the start of estimation of the internal condition is calculated through the other method.

The calculation method of the system SOC at the time of the start of estimation of the internal condition can be any conventionally well-known methods. For example, the SOC estimated based on the relationship between the open circuit voltage in the electricity storage system block 2 as explained above and the SOC value may be applied.

Next, the internal condition estimating system obtains (S102) voltage value information of all batteries 1 that construct the electricity storage system block 2. The obtained voltage information is transmitted, as the voltage value of each battery 1, the voltage value memory 51 in the system cell voltage determining unit 5. The voltage value memory 51 stores the voltage values of the respective batteries 1 per a time. In addition, the internal condition estimating system obtains (S103) current information flowing through all batteries 1 that construct the electricity storage system block 2. The obtained current information is transmitted to, as the current value of each battery 1, the system SOC estimating unit 6.

Subsequently, the system cell voltage determining unit 5 gives weighting to the voltage value stored in the voltage value memory 51 in accordance with the pre-calculated SOC of the electricity storage system block 2. At this time, as the voltages to which the weighting is given, the maximum voltage value and the minimum voltage value among the voltage values of the respective batteries 1 per a time are selected (S104). In addition, the system cell voltage determining unit 5 gives weighting to the maximum voltage value and the minimum voltage value based on the weighting condition to the selected voltage value, thereby determining (S105) the system cell voltage Vsys.

Next, the system SOC of the electricity storage system block 2 is estimated (S106) based on the determined system cell voltage Vsys and the current value flowing through the electricity storage system block 2.

When the estimation of the internal condition is continued (S107: NO), based on the system SOC estimated in S106, the weighting is given to the voltage value stored in the voltage value memory 51 to determine the system cell voltage Vsys, and the system SOC of the electricity storage system block 2 is estimated based on this system cell voltage Vsys and the current information flowing through the electricity storage system block 2. By repeating S104 to S106, the system SOC is continuously estimated up to the end of estimation (S107: YES).

According to this embodiment, through the above processes, the SOC of the electricity storage system can be estimated. In addition, as for the determination of the system cell voltage Vsys, the weighting condition can be changed pattern by pattern. The following explanation will be given of the operation of the system cell voltage determining unit 5 with reference to the difference in the weighting condition.

(First Pattern)

According to the weighting condition based on the first pattern stored in the determination condition memory 53, weighting is performed on the minimum voltage value and the maximum voltage value in accordance with the pre-calculated system SOC. Hence, when it is estimated that the SOC of the electricity storage system block 2 is within the low SOC region, weighting to the minimum voltage is increased. Conversely, when it is estimated that the SOC of the electricity storage system block 2 is within the high SOC region, weighting to the maximum voltage is increased.

Figure 3:
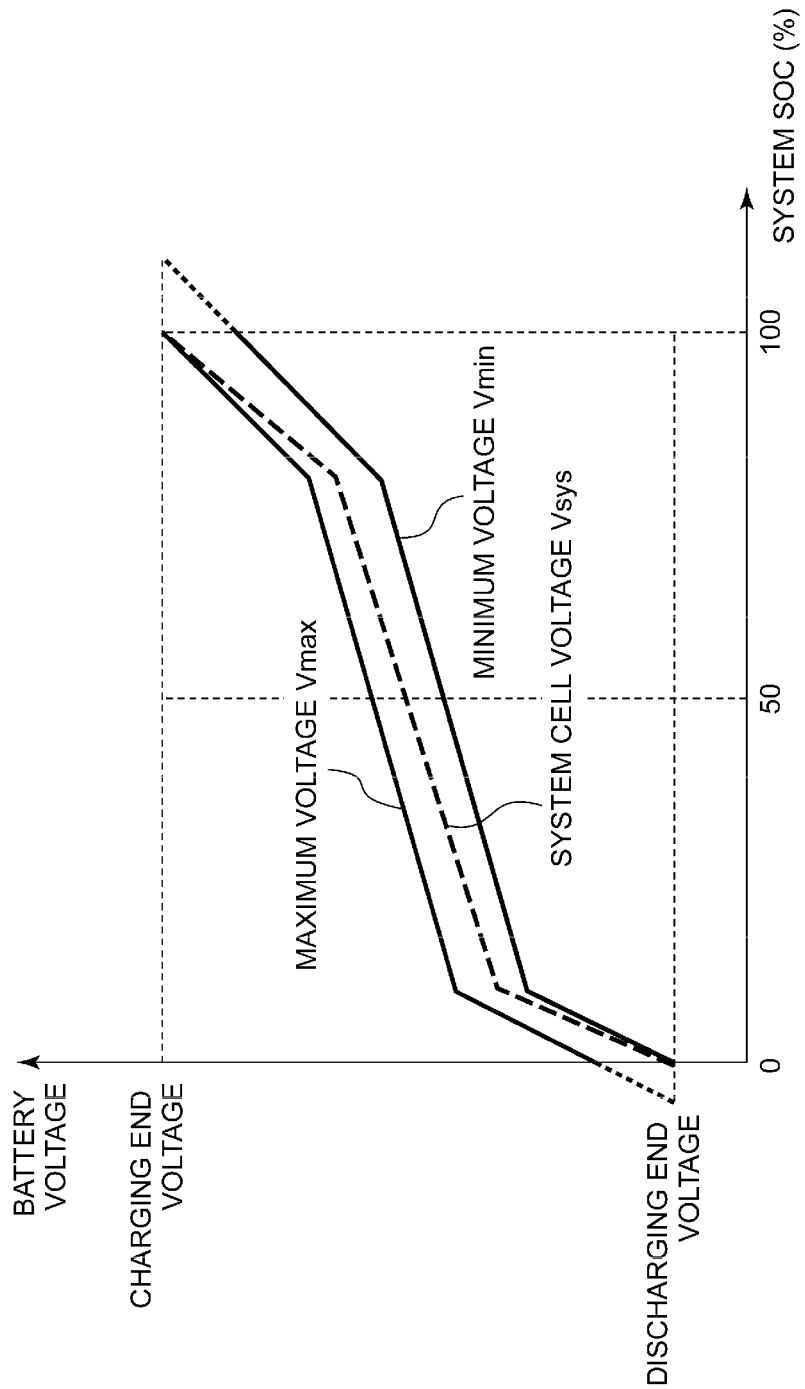
FIG. 3 is a graph illustrating a relationship between a system SOC of an electricity storage system block and a system cell voltage according to the first embodiment of the present disclosure.

FIG. 3 is a graph illustrating the system cell voltage Vsys determined based on the first-pattern weighting condition. In FIG. 3, when the system SOC is zero, the system cell voltage Vsys is consistent with the minimum voltage Vmin. At this time, the minimum voltage Vmin is consistent with a discharging end voltage.

When the system SOC is increased from this condition, the weighting to the minimum voltage Vmin decreases, while at the same time, the weighting to the maximum voltage Vmax increases. When, for example, the system SOC becomes 20 [%], the system cell voltage Vsys can be expressed by the following formula.

[Formula 5]

$$V\text{sys}=20[\%]/100\times V\text{max}+(100-20[\%])/100\times V\text{min} \quad (5)$$

That is, as for the system cell voltage Vsys when the system SOC=20 [%], the weighting that is 20% is given to the maximum voltage Vmax, and the weighting that is 80 [%] is given to the minimum voltage Vmin. When the system SOC is 20 [%] in FIG. 3, a line indicating the system cell voltage Vsys is located near the minimum voltage Vmin.

In addition, as the system SOC becomes higher than 20 [%], the system cell voltage Vsys becomes further apart from the minimum voltage Vmin, and is shifted to the maximum-voltage-Vmax side. When the system SOC becomes 70 [%], the weighting that is 70 [%] is given to the maximum voltage Vmax, and the weighting that is 30 [%] is given to the minimum voltage. When the system SOC is 70 [%] in FIG. 3, the line indicating the system cell voltage Vsys is located near the maximum voltage Vmax.

Next, when the system SOC becomes 100, the weighting that is 100 [%] is given to the maximum voltage Vmax, and thus the system cell voltage Vsys becomes consistent with the maximum voltage Vmax. At this time, the maximum voltage Vmax is consistent with the charging end voltage.

Based on the weighting condition indicated by the formula (2), when it is estimated that the SOC of the electricity storage system block 2 is within the low SOC region, the weighting to the minimum voltage is increased, and when it is estimated that the SOC of the electricity storage system block 2 is within the high SOC region, the weighting to the maximum voltage is increased.

(Second Pattern)

According to the weighting condition based on the second pattern stored in the determination condition memory 53, when the SOC region for charging/discharging is less than the threshold A, the minimum voltage is adopted, and in the case of equal to or greater than the threshold A, the maximum voltage is adopted.

Figure 4:
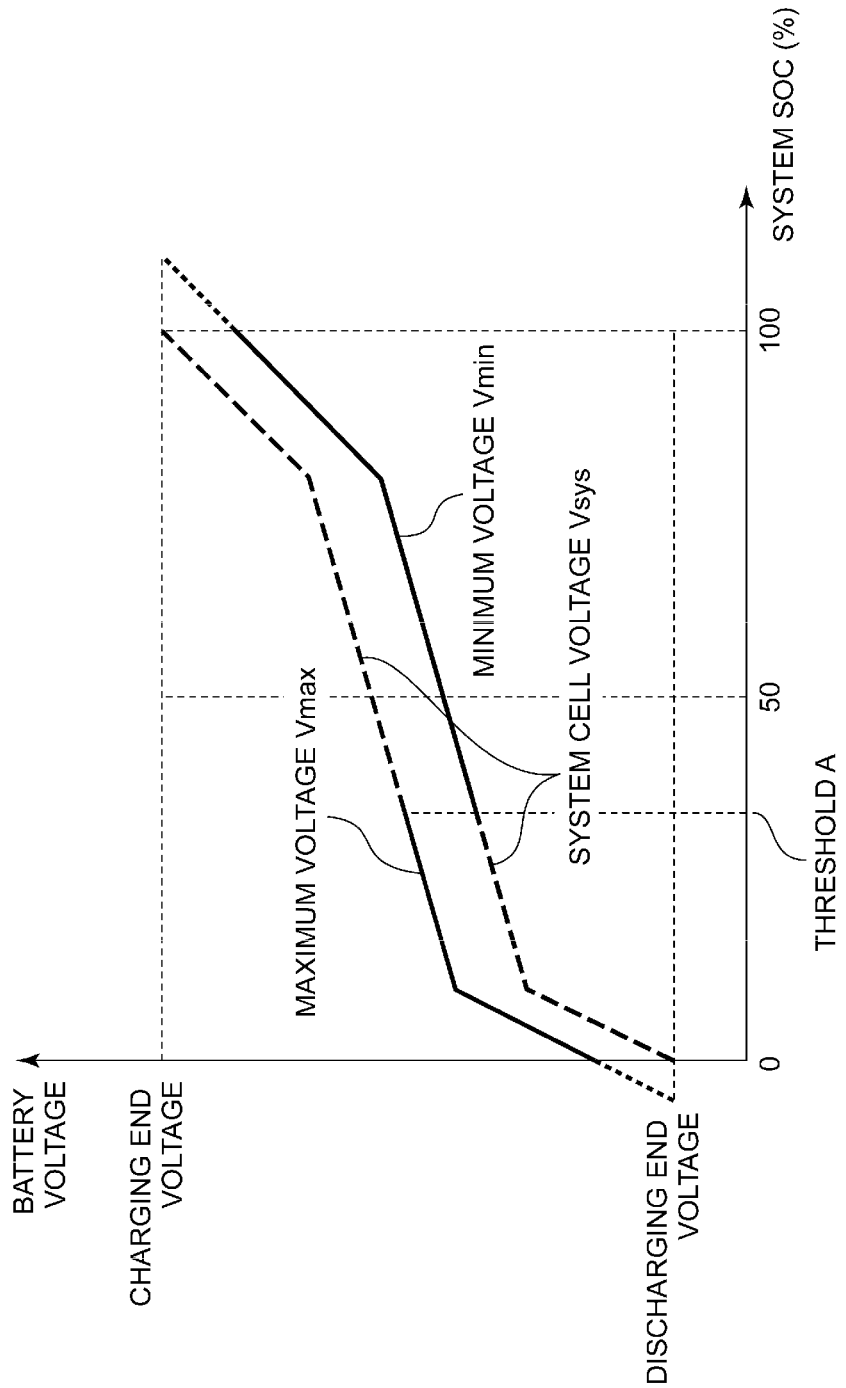
FIG. 4 is a graph illustrating a relationship between the system SOC of the electricity storage system block and the system cell voltage according to the first embodiment of the present disclosure.

FIG. 4 is a graph illustrating the system cell voltage Vsys determined based on the second-pattern weighting condition when the threshold A is 35 [%]. In FIG. 4, when the system SOC is zero, the system cell voltage Vsys is consistent with the minimum voltage Vmin. At this time, the minimum voltage Vmin is consistent with the discharging start/end voltage.

When the system SOC is increased from 0 [%], the minimum voltage Vmin also increases together with the increase of the system SOC. In addition, when the system SOC is less than the threshold A, the system cell voltage Vsys is consistent with the minimum voltage Vmin. Hence, when the minimum voltage Vmin increases, the system cell voltage Vsys also increases.

In addition, when the system SOC increases and exceeds the threshold that is SOC=35 [%], the system cell voltage Vsys becomes consistent with the maximum voltage Vmax. In FIG. 4, a line indicating the system cell voltage Vsys is consistent with the minimum voltage Vmin when SOC=less than 35 [%] that is the threshold, and is consistent with the maximum voltage Vmax when SOC=35 [%].

Still further, when the system SOC is 100, the system cell voltage Vsys is consistent with the maximum voltage Vmax. At this time, the maximum voltage Vmax is consistent with the charging end voltage.

(Third Pattern)

According to the weighting condition based on the third pattern stored in the determination condition memory 53, when the SOC region for charging/discharging is less than the threshold A, the minimum voltage is adopted, and in the case of equal to or greater than the threshold B, the maximum voltage is adopted, and, the average voltage is adopted within the intermediate region.

Figure 5:
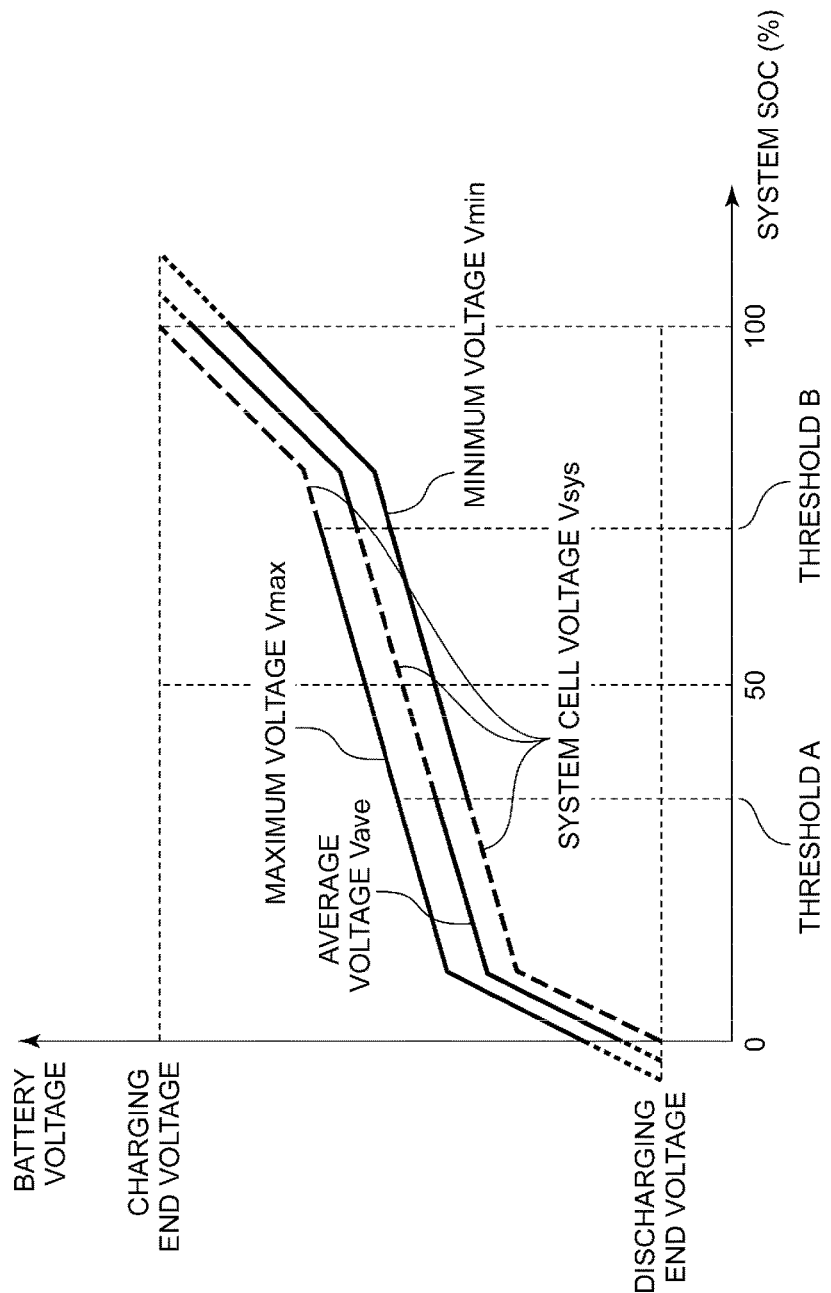
FIG. 5 is a graph illustrating a relationship between the system SOC of the electricity storage system block and the system cell voltage according to the first embodiment of the present disclosure.

FIG. 5 is a graph illustrating the system cell voltage Vsys determined based on the third-pattern weighting condition when the threshold A is 35 [%] and the threshold B is 70 [%]. In FIG. 5, when the system SOC is zero, the system cell voltage Vsys is consistent with the minimum voltage Vmin. At this time, the minimum voltage Vmin is consistent with the discharging start/end voltage.

When the system SOC is increased from 0 [%], the minimum voltage Vmin also increases together with the increase of the system SOC. In addition, when the system SOC is less than the threshold A, the system cell voltage Vsys is consistent with the minimum voltage Vmin. Hence, when the minimum voltage Vmin increases, the system cell voltage Vsys also increases.

In addition, when the system SOC increases and exceeds the threshold that is SOC=35 [%], the system cell voltage Vsys is set as the average voltage between the maximum voltage Vmax and the minimum voltage Vmin. Next, when the system SOC increases and exceeds the threshold that is SOC=70 [%], the system cell voltage Vsys becomes consistent with the maximum voltage Vmax. In FIG. 5, a line indicating the system cell voltage Vsys is consistent with the minimum voltage Vmin when SOC=less than 35 [%] that is the threshold, is consistent with the average value when SOC=equal to or greater than 35 [%] and SOC=less than 70 [%], and, is consistent with the maximum voltage Vmax when SOC=equal to or greater than 70 [%].

Still further, when the system SOC is 100, the system cell voltage Vsys is consistent with the maximum voltage Vmax. At this time, the maximum voltage Vmax is consistent with the charging end voltage.

[1-3. Effects]

According to this embodiment including the above structure and action, the following effects can be accomplished.

(1) In general, batteries have a self-discharging, and the amount of self-discharging varies battery by battery. Hence, the batteries 1 that configure the electricity storage system 1 have a different voltage, and thus the maximum voltage and the minimum voltage can be obtained. A method of estimating the SOC based on either voltage and taking this estimated SOC as the system SOC is possible, but according to this method, an error in the estimation may increase at the end of discharging or the end of charging.

Figure 6:
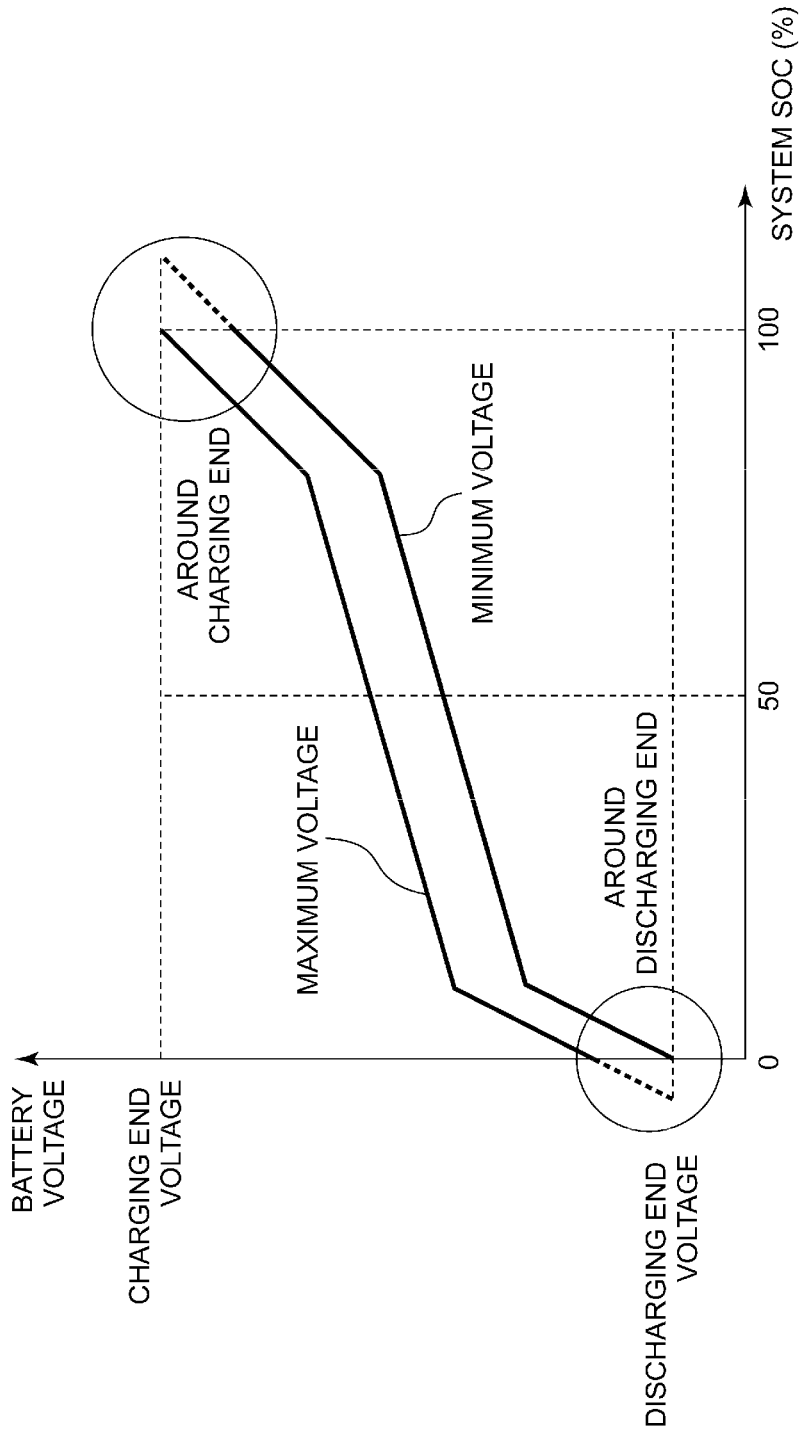
FIG. 6 is a graph illustrating a relationship among a system SOC of a conventional electricity storage system block, the lowest voltage of the electricity storage system block, and the highest voltage thereof.

For example, with reference to FIG. 6, when the maximum voltage is adopted for the estimation, as for the behavior around the end of charging, the maximum voltage first reaches the charging end voltage, so there is no technical problem. Conversely, as for the behavior around the end of discharging, the minimum voltage first reaches the discharging end voltage. It is general that the electricity storage system has the system SOC set to be 0 [%] in order to avoid an excessive discharging, but the maximum voltage has not reached the discharging end voltage yet. Hence, there is a lag.

Accordingly, when this maximum voltage is adopted, the estimated system SOC possibly contains a further large error. Conversely, when the minimum voltage is adopted for the estimation, a lag is likewise caused. In addition, a method of estimating the SOCs of all batteries 1 and taking the average value thereof as the system SOC may be possible, but in the case of a large-scale electricity storage system, it is necessary to perform calculation battery by battery although the number of batteries 1 is quite large, and thus the amount of calculation may increase.

In this embodiment, however, weighting is given to the voltage value of the battery 1 in the electricity storage system block 2 measured in accordance with the pre-calculated system SOC value of the electricity storage system block 2, and the obtained value is taken as the system cell voltage Vsys. Based on this weighting, the system cell voltage Vsys is determined in accordance with the minimum voltage adopted dominantly around the end of discharging, and the maximum voltage adopted dominantly around the end of charging. Hence, the voltage value appropriately reflecting the condition of the electricity storage system is applicable for the estimation of the system SOC, and excessive charging/discharging can be avoided.

(2) In addition, in the estimation of the system SOC of the electricity storage system, since the number of batteries 1 is quite large, it is unclear which voltage of the battery should be applied for the estimation. According to this embodiment, however, to estimate the system SOC of the electricity storage system, the system cell voltage Vsys is applied. This system cell voltage Vsys is obtained by performing weighting on the maximum voltage and minimum voltage among the voltage values of the batteries 1 that configure the electricity storage system. Hence, a work of selecting the maximum value and the minimum value among plural pieces of data is enabled, and the calculation of the system cell voltage Vsys from the two pieces of data that are the selected maximum voltage value and minimum voltage value is enabled. Therefore, the system SOC can be estimated with a little amount of calculation.

(3) Still further, according to this embodiment, the system cell voltage Vsys can be determined based on the plural weighting conditions. Hence, by selecting the optimized weighting in accordance with the structure of the electricity storage system block 2, the installation location, etc., a further highly precise system SOC can be estimated.

(4) As for the weighting condition, when charging/discharging of the electricity storage system block 2 is performed in the low SOC region, the weighting to the minimum voltage is increased, and when charging/discharging is performed in the high SOC region, the weighting to the maximum voltage is increased. Consequently, the system cell voltage Vsys to be calculated becomes a continuous value. Hence, the value of the system SOC estimated based on such a continuous value can be also a continuous value.

(5) As for another weighting condition, when the SOC region for charging/discharging is less than the threshold A, the minimum voltage is adopted, and in the case of equal to or greater than the threshold A, the maximum voltage is adopted. By changing the adopted value between the minimum value and the maximum value based on the one threshold A to set the system cell voltage Vsys, the amount of calculation can be reduced, and a highly precise system SOC can be estimated although through a simple system.

(6) As for the other weighting condition, when the SOC region for charging/discharging is less than the threshold A, the minimum voltage is adopted, in the case of equal to or greater than the threshold B, the maximum voltage is adopted, and the average voltage is adopted within the intermediate region. By changing the adopted value among the minimum voltage, the maximum voltage, and the average value based on the two thresholds, in addition to the effect of (5), a change in system cell voltage Vsys at the time of changing the adopted value can be reduced.

2. Second Embodiment

[2-1. Structure]

An explanation will be given of an internal condition estimating system according to a second embodiment. In the second embodiment, when the system SOC is estimated, a system cell temperature Tsys reflecting the temperature of the electricity storage system is applied, and thus a further accurate system SOC can be estimated. The same structure as that of the first embodiment will be denoted by the same reference numeral, and the duplicated explanation thereof will be omitted.

Figure 7:
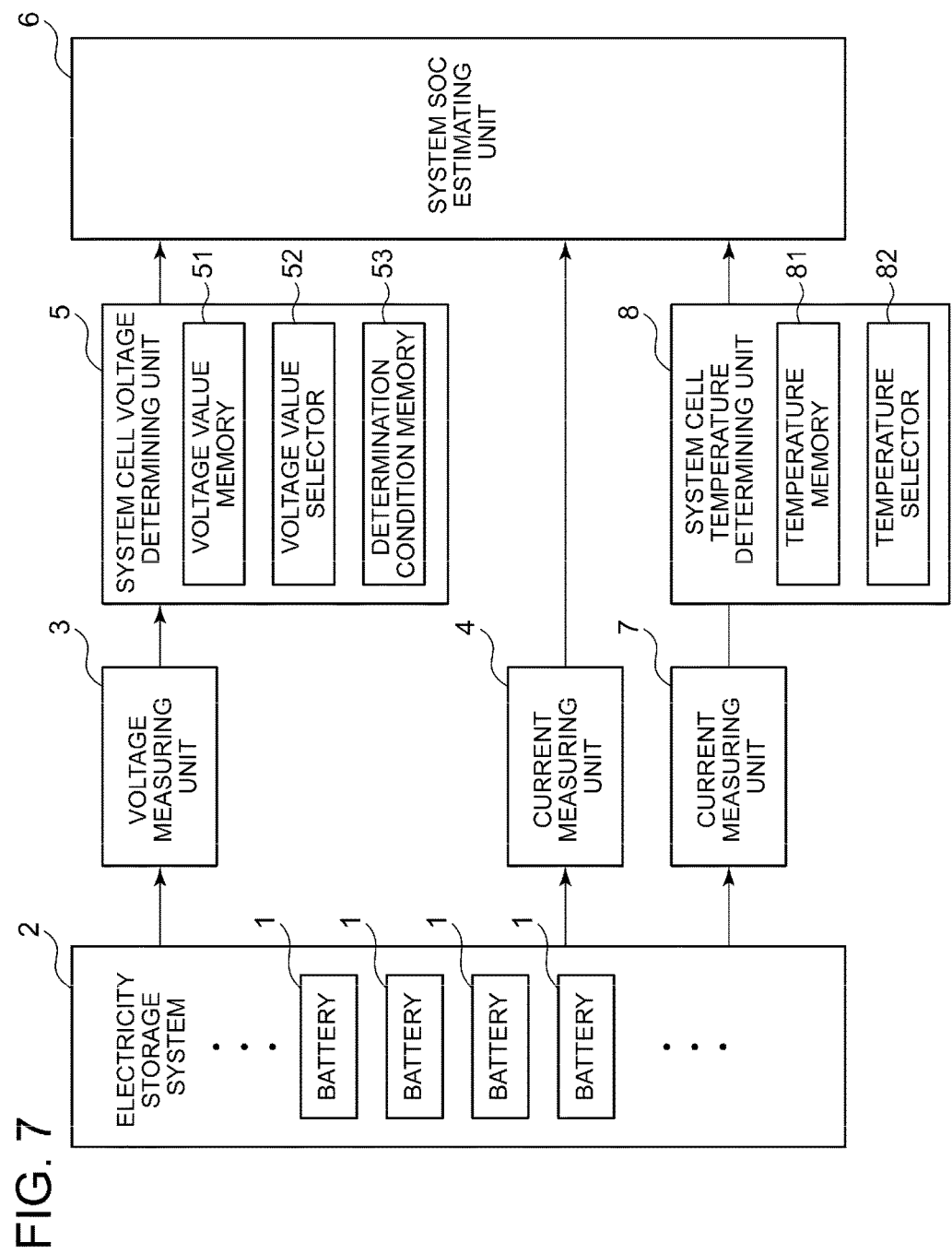
FIG. 7 is a block diagram illustrating a structure of an internal condition estimating system according to a second embodiment of the present disclosure.

FIG. 7 is a block diagram illustrating a structure of the internal condition estimating system according to this embodiment. The internal condition estimating system of this embodiment includes a temperature measuring unit 7 and a system cell temperature determining unit 8 in addition to the structure of the first embodiment.

The temperature measuring unit 7 measures the temperatures of all batteries 1 that construct the electricity storage system block 2. The temperature measuring unit 7 measures the temperature of the battery 1 through an arbitrary method. When, for example, the electricity storage system block 2 includes m number of batteries 1, as for the battery 1 subjected to measurement, the temperatures T1-Tm are measured, and the measured temperatures T1-Tm of the respective batteries 1 are output to the system cell temperature determining unit 8.

The system cell temperature determining unit 8 determines a system cell temperature Tsys of the electricity storage system block 2 based on the temperatures T1-Tm of the batteries 1 transmitted from the temperature measuring unit 7. The system cell temperature Tsys is a temperature applied to estimate the SOC value of the electricity storage system block 2.

The system cell temperature determining unit 8 determines the lowest temperature or the average temperature as the system cell temperature Tsys. The system cell temperature determining unit 8 includes a temperature memory 81, and a temperature selector 82.

The temperature memory 81 stores the temperature values T1-Tm of the batteries 1 transmitted from the temperature measuring unit 7. The temperatures T1-Tm to be stored are temperatures of all batteries 1 in the electricity storage system block 2 per a time, and for example, temperature values Tt1 to Ttm at a time t1 are stored.

The temperature selector 82 selects, in accordance with the temperature to be adopted as the system cell temperature Tsys, a lowest temperature Tmin or an average Tave among the temperature values Tt1 to Ttm stored in the temperature memory 51.

[2-2. Action]

Figure 8:
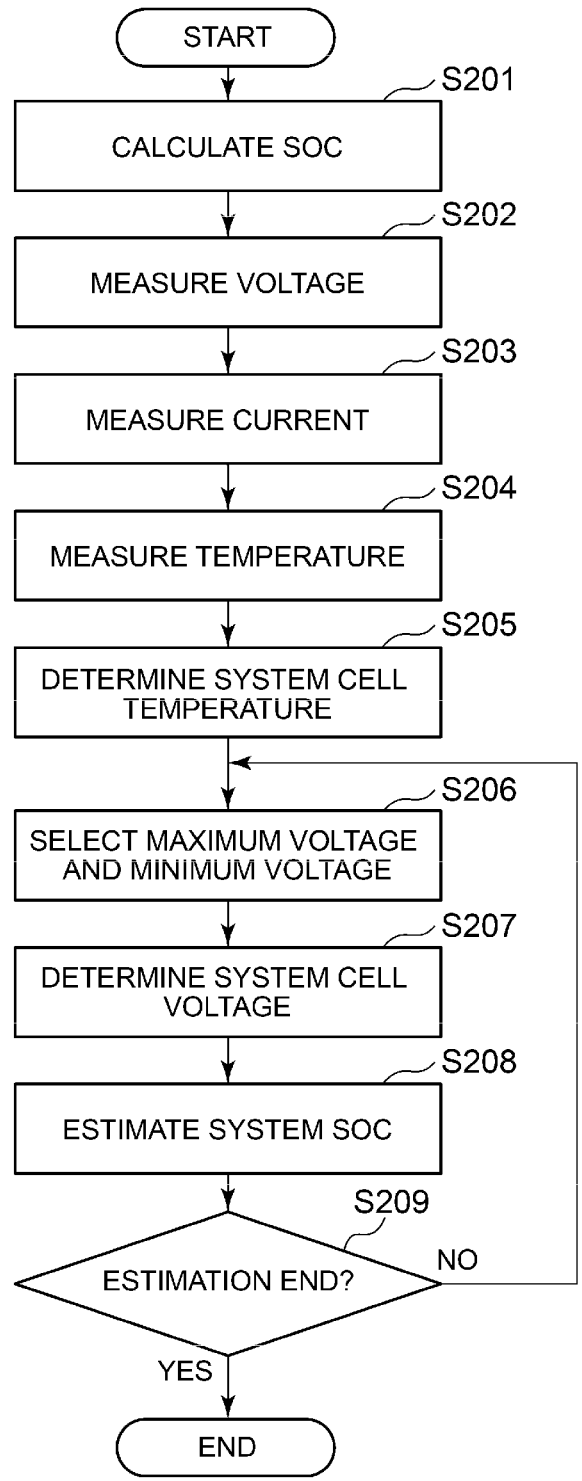
FIG. 8 is a flowchart illustrating an operation of the internal condition estimating system according to the second embodiment of the present disclosure.

The operation of the internal condition estimating system illustrated in FIG. 7 and employing the above structure is generally as follow. FIG. 8 is a flowchart illustrating processes of estimating the internal condition of the electricity storage system block 2 by the internal condition estimating system.

Like the above embodiment, when the estimation of the internal condition starts, the provisional system SOC is calculated, and the voltage values and current values of all batteries 1 that configure the electricity storage system block 2 are measured (S201 to S203) like the above embodiment. The internal condition estimating system obtains (S204) temperatures of all batteries 1 that configure the electricity storage system block 2. Next, the system cell temperature Tsys in accordance with the condition is determined (S205). The determined system cell temperature Tsys is transmitted to the system SOC estimating unit 6 as the temperatures of the batteries 1.

Next, the system cell voltage determining unit 5 selects the maximum voltage value and the minimum voltage value as the voltages to which the weighting is given, and gives the weighting to the maximum voltage value and the minimum voltage value, thereby determining the system cell voltage Vsys (S206 to S207).

Subsequently, the system SOC of the electricity storage system block 2 is estimated (S208) based on the system cell voltage Vsys, the system cell temperature Tsys, and the current value flowing through the electricity system block 2.

When the estimation of the internal condition is continued (S209: NO), based on the system SOC estimated in S208, the weighting is added to the voltage value stored in the voltage value memory 51 to determine the system cell voltage Vsys, and the system SOC of the electricity storage system block 2 is estimated based on this system cell voltage Vsys, the system cell temperature Tsys, and the current information flowing through the electricity storage system block 2. By repeating S206 to S209, the system SOC is continuously estimated up to the end of estimation (S209: YES).

[2-3. Effects]

According to this embodiment including the above structure and action, the following effects can be accomplished.

(1) As for the estimation of the system SOC by the system SOC estimating unit 6, in general, the characteristics of the battery also depend on a temperature, and thus it is necessary to also consider the adverse effect of the temperature of the battery that is utilized in a wide environmental temperature range. As an example, in view of resistances that configure the battery equivalent circuit model, the higher the temperature is, the faster the chemical reaction of the battery becomes. Hence, the resistance value becomes small. Conversely, the lower the temperature is, the larger the resistance value becomes.

According to this embodiment, the system cell temperature Tsys changes in accordance with a change in temperature of the electricity storage system block 2. Hence, in the estimation of the system SOC by the system SOC estimating unit 6, by creating, for example, a function of the resistance relative to the temperature to obtain the temperature dependency, such temperature dependency can be applied to estimate the system SOC in accordance with the temperature change.

(2) In addition, the electricity storage system block 2 includes the plural batteries 1. Accordingly, when the temperatures of the respective batteries 1 vary depending on the location of the battery relative to the electricity storage system and the location of a cooling device, etc., the highest temperature, the lowest temperature, and the average temperature can be obtained.

When a high-temperature battery and a low-temperature battery discharge at the same SOC and at the constant current, the voltage drop in the low-temperature battery notably occurs, and reaches the end of discharging first. That is, by adopting the lowest temperature as the system cell temperature Tsys, the lowest SOC that still enables discharging can be presented.

In addition, when the highest temperature, the lowest temperature, or the arbitrary temperature of the battery is taken as the system cell temperature Tsys and such temperature shows an abnormal value due to a malfunction of, for example, thermocouple, the SOC is to be calculated based on such a value. Consequently, the calculated SOC contains a large error. When, however, the average temperature is taken as the system cell temperature Tsys, an adverse effect originating from the abnormal temperature value can be suppressed, and a highly precise SOC can be estimated stably.

When the lowest temperature or the average temperature is taken as the system cell temperature Tsys, even if the temperature of the battery 1 varies, a highly precise system SOC can be estimated.

(3) The temperature measuring unit 7 measures the temperatures of all batteries that configure the electricity storage system block 2, but it is unnecessary to provide temperature measurers for all batteries and to directly measure the temperature of individual battery. For example, the location where the batteries 1 of the electricity storage system block 2 are installed may be divided into plural blocks, and the temperatures of the batteries 1 may be indirectly measured by measuring the temperature per a block.

3. Third Embodiment

[3-1. Structure]

An internal condition estimating system according to a third embodiment will be explained. In the third embodiment, the measuring method of the current of the electricity storage system is changed from each of the above embodiments. The same structure as that of each of the above embodiments will be denoted by the same reference numeral, and the duplicated explanation will be omitted.

Figure 9:
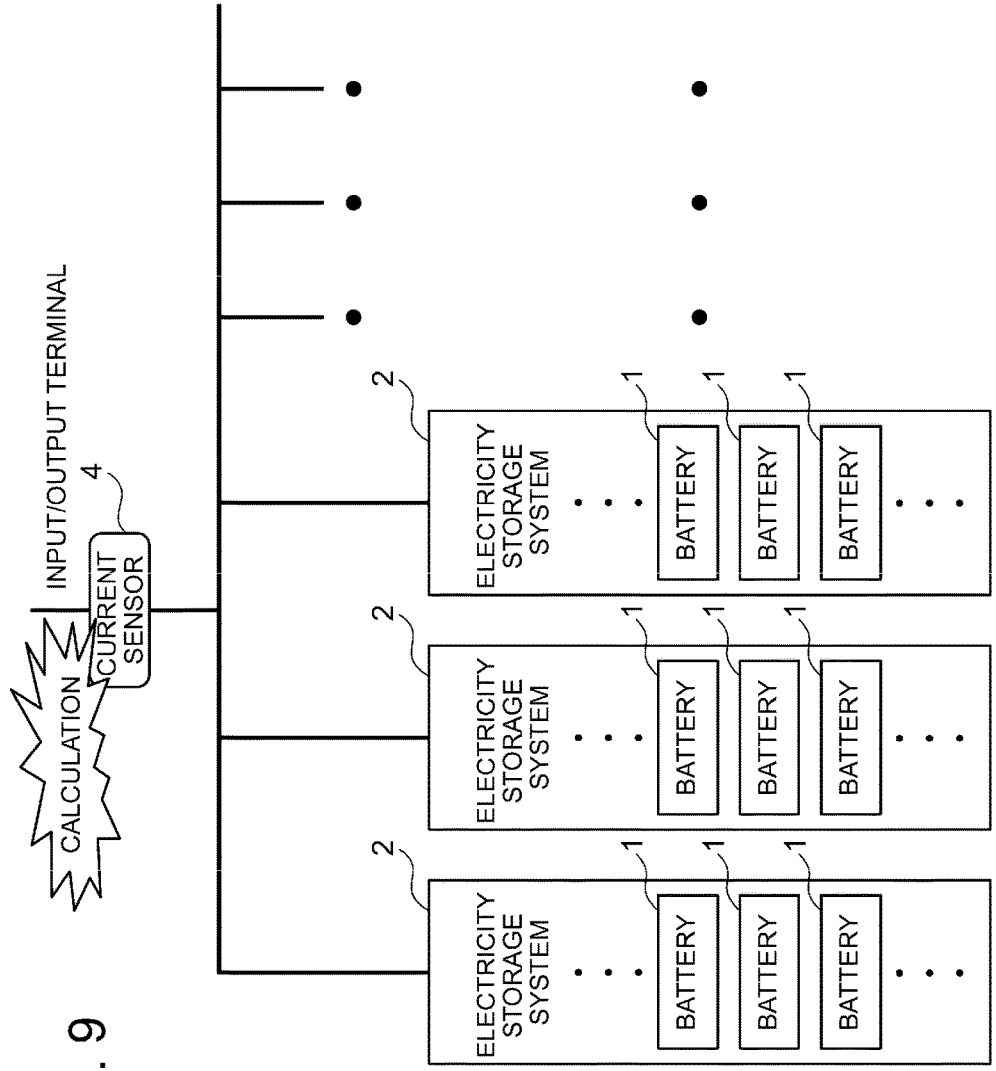
FIG. 9 is a block diagram illustrating a structure of an internal condition estimating system according to a third embodiment of the present disclosure.

FIG. 9 is a block diagram illustrating a structure of the internal condition estimating system according to this embodiment. The internal condition estimating system of this embodiment has a current sensor 4 that is a current measurer provided at the input/output terminal of the electricity storage system.

[3-2. Action and Effects]

According to the internal condition estimating system of this embodiment employing the above structure, the current at the input/output terminal of the electricity storage system is measured, and the current flowing through the batteries 1 in the electricity storage system is calculated based on the measured current. That is, when the batteries 1 are connected by the multiple parallel-series connection scheme in the electricity storage system block 2, by dividing the measured current value by the number of parallel strings, the current value flowing through each battery 1 can be calculated. Accordingly, in addition to the effects of each of the above embodiments, the number of current sensors can be reduced, annoying data communication can be reduced, the amount of calculation by a processing CPU can be reduced, and the like.

In addition, the large number of battery systems may be connected in parallel to utilize those battery systems as a large-capacity battery system. In this case, when the current values flowing through all batteries 1 that configure the large-capacity battery system are calculated based on current information from the current estimating units 4 provided at the respective battery systems, the current measuring units 4 having the same number as that of battery systems that configure the large-capacity battery system are necessary. When, for example, the current value flowing through the battery 1 is calculated by not the current measuring unit 4 but a control device installed at a different location, wirings for a transmission from the current measuring unit 4 to the control device are necessary, and the amount of current values to be transmitted is large.

For such a large-capacity battery system, by applying this embodiment, the number of current sensors can be reduced, annoying data communication can be reduced, and the amount of calculation by a processing CPU can be reduced. That is, according to this embodiment, although the current measuring unit is installed at the input/output terminal of the electricity storage system, when the current measuring unit is installed at the input/output terminal of the large-capacity battery system, the above technical problems can be addressed.

4. Other Embodiments

The above-described embodiment is presented herein as an example and is not intended to limit the scope of the invention. That is, it can be put into practice in other various forms and is capable of various omissions, replacements, and changes within a range not departing from the scope of the invention. These embodiments and their variations are included in the scope and the gist of the invention and are also included in the invention described in the scope of claims and the range of its equivalents.

For example, in each of the above embodiments, the voltage measuring unit 3 measures all voltage values in the electricity storage system block 2, but information indicating to which battery 1 the measured voltage corresponds may be added to the data on the voltage value. This enables a user to know the location of the battery 1 that shows the maximum voltage or the minimum voltage adopted when the system cell voltage determining unit 5 determines the system cell voltage Vsys. In addition, by calculating the system SOC in consideration of the temperature of the installation location, a further precise SOC can be presented.

REFERENCE SIGNS LIST

1 Battery
2 Electricity storage system block
3 Voltage measuring unit
4 Current measuring unit
5 System cell voltage determining unit
51 Voltage value memory
52 Voltage value selector
53 Determination condition memory
6 System SOC estimating unit
7 Temperature measuring unit
8 System cell temperature determining unit
81 Temperature memory
82 Temperature selector

The invention claimed is:

1. An internal condition estimating system that estimates a system state of charge ("SOC") of an electricity storage system block comprising a plurality of batteries, the internal condition estimating system comprising:

a voltage measuring unit measuring a voltage of the plurality of batteries;
a current measuring unit measuring a current flowing through the plurality of batteries;
a system cell voltage determining unit determining, based on a voltage value of the plurality of batteries measured by the voltage measuring unit, a system cell voltage; and
a system SOC estimating unit estimating, based on the current flowing through the battery and the system cell voltage, the SOC of the electricity storage system block,
wherein the batteries in the electricity storage system block are connected in a multiple parallel-series connection, in which a plurality of groups are connected in parallel, the groups each including the batteries connected in series,
the current measuring unit is installed at one location in the electricity storage system block, and calculates the current value flowing through the battery that configures the electricity storage system block based on the current value measured at the installation location,
the system cell voltage determining unit determining the system cell voltage by giving a weighting to the voltage value in accordance with a pre-calculated SOC of the electricity storage system block.

2. The internal condition estimating system according to claim 1, wherein the system cell voltage determining unit comprises:
a voltage value memory storing voltage values per a time of the plurality of batteries measured by the voltage measuring unit;
a voltage value selector selecting a maximum voltage value and a minimum voltage value among the voltage values stored in the voltage value memory; and
a determination condition memory storing a weighting condition for the maximum voltage and the minimum voltage.

3. The internal condition estimating system according to claim 2, wherein the determination condition memory stores the weighting condition which increases the weighting to the minimum voltage when charging/discharging of the electricity storage system block is performed within a low SOC region, and which increases the weighting to the maximum voltage when the charging/discharging is performed within a high SOC region.

4. The internal condition estimating system according to claim 2, wherein the determination condition memory stores:
a first threshold in the SOC of the electricity storage system block; and
the weighting condition which adopts the minimum voltage as the system cell voltage when the SOC of the electricity storage system block is less than the first threshold, and which adopts the maximum voltage as the system cell voltage when the SOC of the electricity storage system block is equal to or greater than the first threshold.

5. The internal condition estimating system according to claim 2, wherein the determination condition memory stores:
first and second thresholds in the SOC of the electricity storage system block; and
the weighting condition which adopts the minimum voltage as the system cell voltage when the SOC of the electricity storage system block is less than the first threshold, adopts as the system cell voltage, an average voltage that is an average value of the voltage values of the plurality of batteries when the SOC of the electricity storage system block equal to or greater than the first threshold but less than the second threshold, and adopts the maximum voltage as the system cell voltage when the SOC of the electricity storage system block is equal to or greater than the second threshold.

6. The internal condition estimating system according to claim 4, wherein the first threshold is set in a region where a slope of a charge/discharge curve of the electricity storage system block is gradual.

7. The internal condition estimating system according to claim 5, wherein the first threshold and the second threshold are set in a region where a slope of a charge/discharge curve of the electricity storage system block is gradual.

8. The internal condition estimating system according to claim 1, further comprising:
a temperature measuring unit measuring a temperature of the plurality of batteries; and
a system cell temperature determining unit determining a system cell temperature that is a reference for the estimation of the SOC of the electricity storage system block,
wherein the system SOC estimating unit estimates the SOC of the electricity storage system block based on the current flowing through the battery, the system cell voltage, and the system cell temperature.

9. The internal condition estimating system according to claim 1, wherein as the pre-calculated SOC of the electricity storage system block, the SOC of the electricity storage system block estimated by the system SOC estimating unit is adopted.

10. The internal condition estimating system according to claim 1, wherein as the pre-calculated SOC of the electricity storage system block, the SOC estimated based on a relationship between an open circuit voltage of the electricity storage system block and the SOC is adopted.

11. An internal condition estimating method of estimating a state of charge ("SOC") of an electricity storage system block comprising a plurality of batteries, wherein the batteries in the electricity storage system block are connected in a multiple parallel-series connection, in which a plurality of groups are connected in parallel, the groups each including the batteries connected in series,
the internal condition estimating method comprising:
a voltage measuring step of measuring a voltage of the plurality of batteries;
a current measuring step that calculates a current value flowing through the storage batteries based on a current value measured at one place of the storage system section;
a step of selecting a maximum voltage value and a minimum voltage value among the voltage values that are measured in the voltage measuring step;
a system cell voltage determining step of determining a system cell voltage by giving a weighting to the maximum voltage value and the minimum voltage value in accordance with a pre-calculated system SOC; and
a system SOC estimating step of estimating, based on the current flowing through the battery and the system cell voltage, the SOC of the electricity storage system block.

12. The internal condition estimating method according to claim 11, further comprising a step of calculating a provisional system SOC, wherein in the system cell voltage determining step, the system cell voltage is determined by giving a weighting to the maximum voltage value and the minimum voltage value in accordance with the provisional system SOC.

13. The internal condition estimating method according to claim 11, wherein in the system cell voltage determining step, the system cell voltage is determined by giving a weighting to the maximum voltage value and the minimum voltage value in accordance with the pre-calculated system SOC that is the SOC estimated by system SOC estimating step.

* * * * *